United States Patent Office 3,357,831
Patented Dec. 12, 1967

3,357,831
PHOTOPOLYMER

Chisung Wu, South Charleston, W. Va., assignor to Harris-Intertype Corporation, Cleveland, Ohio, a corporation of Delaware

No Drawing. Filed June 21, 1965, Ser. No. 465,698
9 Claims. (Cl. 96—33)

ABSTRACT OF THE DISCLOSURE

A photopolymer comprising the cinnamoylated reaction product of an organic solvent soluble mono-ethylinically unsaturated monomer, a mono-epoxide and a water soluble alpha-beta unsaturated aliphatic carboxylic acid. Such photopolymer may also comprise a water soluble salt of such cinnamoylated product, the salt being formed by reaction between the carboxylic group and monovalent cations. Such polymer is prepared by reacting in solution the defined monomer, mono-epoxide and acid, preferably using a molar excess of acid with respect to mono-epoxide. A hydroxyl group formed on the hydroxy ester moiety of the resulting product is then cinnamoylated.

This application is a continuation-in-part of Ser. No. 145,454, filed Oct. 16, 1961 now abandoned.

The present invention relates to a novel photopolymer, and more particularly, to an inherently light-sensitive, alkali-susceptible photopolymerizable composition and its use in lithographic and photomechanical processes.

For many years photomechanical reproduction has depended largely on the use of a colloidal layer of gum arabic and the like containing a photosensitive hardening agent such as a bichromate salt. More recently, use of photosensitive or light-sensitive diazo compounds has resulted in the manufacture of presensitized plates, that is, plates to which the light-sensitizer can be applied for extended periods of time prior to actual use. However, both the bichromated colloids and the diazo compoun have material shortcomings which limit their application and use.

For example, a serious shortcoming of the light-sensitive diazo compounds is their chemical decomposition upon contact with metal. Consequently, when a diazo is to be used over a metal plate, which is usually the case, it is essential to use an intervening, protective sub-layer. If this sub-layer is not properly formed, the resulting lithographic plate may be defective or have short storage life. Bichromated colloids deteriorate relatively rapidly after coating, making them unsuitable when long shelf life is desired. In addition, many of the colloidal light-sensitive materials which have previously been suggested as resists for etching must undergo a relatively high temperature oven bake prior to use, thereby increasing the cost and complicating the process of preparation.

The need for still better light-sensitive materials to improve photomechanical reproduction has resulted in attempts to provide entirely different materials possessing an inherent light-sensitivity. Polymers of this type have been described, for example, polyvinyl cinnamate and cinnamate of bisphenolepichlorohydrin resin, which possess inherent photosensitivity and high stability before exposure to light. These polymers, however, are soluble only in organic solvents and accordingly development of a printing plate after exposure requires the rather extensive use of such organic solvents. The high volatility and generally low flash point of these solvents render the process hazardous and toxic to operating personnel, particularly since the development step is practically always carried out in a printing shop where the plates are exposed and where the proper equipment or experience for the handling of such chemicals is generally not available.

The custom built photopolymer of the present invention offers considerable improvement over sensitizers heretofore known. The present photopolymer can be applied directly to a metal support member; does not need an oven bake; and is not only organic solvent-soluble but alkali-susceptible, that is, the photopolymer can be applied from an aqueous alkaline solution and, more importantly, after exposure the polymer can also be developed by washing with an aqueous alkaline solution to remove the unexposed portions. Particularly as compared with diazo light-sensitizers, the present photopolymer is easier to prepare and purify; has a higher stability before exposure especially toward oxygen, humidity and temperature; has a wider range of photosensitivity; a more durable printing surface; a longer storage life; and readily forms a film over a support member.

It is, therefore, a principal object of the invention to provide a novel and improved photopolymer.

Another object is to provide an inherently light-sensitive photopolymer for use in preparing or forming a surface type lithographic plate, or letter-press plate, or as an etching resist.

A further object is to provide a photopolymer that can be applied directly in contact with a metal support member or plate, or over such a member having a sub-layer.

A still further object is to provide a photopolymer that is both organic solvent-soluble and alkali-susceptible.

Other objects will become apparent as the description proceeds.

To the accomplishment of the foregoing and related ends, the invention consists of the features hereinafter fully described and particularly pointed out in the claims, the following disclosure describing in detail the invention, such disclosure illustrating, however, but one or more of the various ways in which the invention may be practiced.

A polymer of the present invention comprises a composition of matter composed of the cinnamoylated reaction product of a water-insoluble monoethylenically unsaturated monomer, a monoepoxide, and a water-soluble alpha-beta unsaturated aliphatic carboxylic acid or the water-soluble salts of the above defined cinnamoylated product, the salts being formed by reaction between the carboxylic group and monovalent cations.

The polymer is easily prepared in a surprisingly simple manner by merely reacting in solution the defined monoethylenically unsaturated monomer, the monoepoxide, and the alpha-beta unsaturated acid. When the three ingredients are so simultaneously reacted, the acid is preferably used in molar excess with respect to the monoepoxide, and a hydroxyl group formed on a hydroxy-ester moiety of the terpolymer is then cinnamoylated. In this method of preparation, by using more than an equimolar quantity of the acid with respect to the monoepoxide, only part of the acid will be esterified with the monoepoxide, and consequently, copolymerization may occur among the monoethylenically unsaturated monomer, the alpha-beta unsaturated acid, and the hydroxyester of such acid and monoepoxide to ensure formation of the terpolymer. As an example, copolymerization may take place simultaneously with carboxy-epoxy esterification, or alternatively, the terpolymer may be produced by copolymerizing directly the defined monoethylenically unsaturated monomer, the defined acid, and a hydroxyester of such acid and a monoepoxide.

After cinnomoylation, the carboxylic group of the resulting terpolymer provided by the alpha-beta unsaturated acid can, if desired, be further reacted as hereinafter described to form water-soluble salts. In use, the photopolymer is coated, as from solvent solution, on a support member and the coat exposed to light through a negative or stencil to harden the exposed areas. The coat is then washed with an aqueous alkaline solution to remove the non-exposed areas.

The water-insoluble monoethylenically unsaturated monomer preferably contains an active vinyl group for such unsaturation and is also organic solvent-soluble. As exemplary of such compounds useful in preparing the present photopolymer, the following may be listed:

styrene
vinyl toluene
alpha-methyl styrene
dimethyl styrene
diethyl styrene
cyano styrene
the halostyrenes, including mono-, di-, tri-, and tetra-chloro, bromo, iodo, and fluoro styrenes
isopropenyl toluene
vinyl acetate
vinyl halides
vinyl stearate
vinyl naphthalene
methyl methacrylate
butyl methacrylate
isopropyl methacrylate
methyl ethylacrylate
ethyl methacrylate
ethyl ethylacrylate
methyl acrylate
ethyl acrylate
isopropyl acrylate
butyl acrylate
vinylidene halides
methyl vinyl ether
ethyl vinyl ether
butyl vinyl ether
the methyl and the ethyl esters of vinyl benzoic acid
the methyl and the ethyl di-esters of fumaric acid
the methyl and the ethyl di-esters of maleic acid
the methyl and the ethyl di-esters of itaconic acid
the methyl and the ethyl di-esters of citraconic acid.

Preferred monoethylenically unsaturated monomers are those which undergo free radical copolymerization with an alpha-beta unsaturated carboxylic acid and its hydroxy ester at a sufficiently rapid rate to form a substantially uniform copolymer. Specific desirable monomers include styrene, nuclear substituted styrenes, such as vinyl toluene, chloro styrene, dichlorostyrene, and acrylic or methacrylic esters such as methyl acrylate and methyl methacrylate.

The monoepoxide preferably is a three membered epoxy ring and substantially free of other reactive groups. As exemplary of this class of compounds useful in preparing the present photopolymer, the following may be listed:

ethylene oxide
propylene oxide
butylene oxide
styrene oxide
phenoxypropylene oxide
phenyl glycidyl ether
isopropyl glycidyl ether
butyl glycidyl ether
glycidyl benzoate
glycidyl acetate
epichlorohydrin.

Because of the volatility and chemical reactivity of ethylene oxide, the system employing this epoxide may advantageously be placed under pressure during the course of the reaction. On the other hand, the chemical reactivity of the epoxide ring tends to decrease with increasingly bulky substituents on the ring carbon atom or atoms.

If a monoepoxide of greater molecular weight than the simplest monoepoxide (ethylene oxide) is used, the portion of the resulting terpolymer formed by the epoxide-acid esterification may present the hydroxyl group, which is subsequently reacted with the cinnamoylating agent, at somewhat different spatial orientation with respect to the resulting polymeric unit structure depending on differences among such monoepoxides. For example, such differences may depend on whether the epoxide ring is terminal or disposed within the molecular configuration of the monoepoxide employed; or such differences in spatial orientation may depend on which of the two oxygen bonds of the epoxide ring "breaks" during the reaction to gain a hydrogen atom from the donor acid and forms a hydroxyl group.

To illustrate the latter aspect, in a reaction between propylene oxide and an alpha-beta unsaturated aliphatic carboxylic acid of the type defined, the equation:

(I)

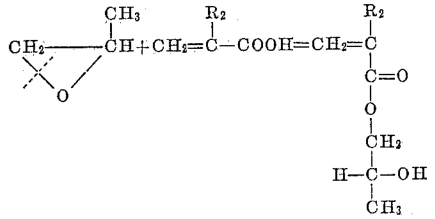

represents one type of reaction when the oxygen bond crossed by the dotted line is broken during the reaction. In contrast, the equation:

(II)

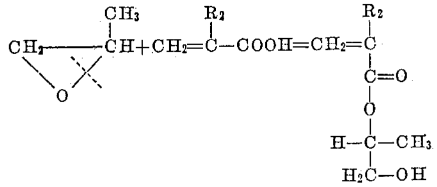

represents the other type of reaction when the other oxygen bond crossed by the dotted line is broken during the reaction.

In all of such cases, including those cases first referred to where the epoxy ring may be either terminal or disposed within the monoepoxide, the net result of the monoepoxide is to become attached to the saturated oxygen atom of the carboxylic group and leave a hydroxyl group for further reaction with the cinnamoylating agent. Accordingly, it is understood that the symbol $R_3$ in the illustrated recurring unit represents the entire residue of the reacted monoepoxide, excluding the hydroxyl group or (after cinnamoylation) the oxygen atom of such group.

The defined alpha-beta unsaturated acid preferably has about three to five carbon atoms including the carbon atom found in the carboxyl group. Use of such acids having more than five carbon atoms is not generally recommended, since they may adversely affect the desired water-solubility of the photopolymer. Exemplary of the alpha-beta unsaturated water-soluble aliphatic carboxylic acid preferred in preparing the present photopolymer are the following:

acrylic acid
alpha-halo acrylic acid
methacrylic acid
ethacrylic acid.

As previously indicated and as described more in detail hereinafter, following preparation of the photopolymer the carboxyl group of the alpha-beta unsaturated acid may be neutralized to provide a water-soluble alkaline salt, such as the sodium, potassium, ammonium, and lithium salts; or reacted with a water-soluble amine to form a quaternary ammonium radical, such as methyl ammonium.

The cinnamoylating agent may be any compound containing the cinnamoyl radical and capable of attaching such radical to the polymer through reaction with the hydroxyl group formed by the epoxide reactant as described. Exemplary of the cinnamoylating agents useful in preparing the present photopolymer are the following:

cinnamic acid
halocinnamic acid
methoxycinnamic acid
ethoxycinnamic acid
nitrocinnamic acid
acid halides of the above acids, e.g., cinnamoyl chloride.

It is understood that mixtures of compatible representative compounds from each described class of reactants can be used.

The composition of the photopolymer can be further understood by considering that the following units or segments may be present.

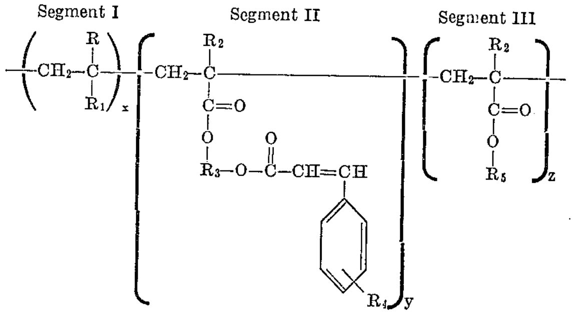

wherein R is a monovalent substituent selected from the group consisting of hydrogen and methyl; $R_1$ is the residue of a water-insoluble and organic solvent-soluble polymerizable monoethylenically unsaturated monomer wherein the carbon atom attached to R and $R_1$ and the carbon atom illustrated to the left thereof formerly defined the monoethylenic unsaturation; $R_2$ is a monovalent substituent selected from the group consisting of hydrogen, methyl, ethyl, and the halogens; $R_3$ is the residue of a monoepoxide having a three membered epoxy ring and being substantially free of other reactive groups; $R_4$ is a monovalent substituent selected from the group consisting of hydrogen, methoxy, ethoxy, nitro, and the halogens; and $R_5$ is a monovalent substituent selected from the group consisting of hydrogen, sodium, potassium, lithium, ammonium, and ionic quaternary ammonium radicals formed from water-soluble amines and *x*, *y*, and *z* are approximately 15 to 60 mol percent, 10 to 60 mol percent, and 20 to 50 mol percent respectively, the sum of *x*, *y*, and *z*, of course, equalling 100 mol percent; and wherein Segments I through III are produced, respectively, by the water-insoluble monoethylenically unsaturated monomer, the cinnamoylated hydroxyester of the alpha-beta unsaturated water-soluble carboxylic acid and the monoepoxide, and the alpha-beta unsaturated water-soluble aliphatic carboxyl acid and the water-soluble salts thereof.

It should be understood that such representation is, of course, only exemplary of the photopolymer, as the recurring units or segments may not be present in the sequence illustrated depending upon the relative reactivity of the particular starting materials and the quantities of such which are used. For example, the monoethylenically unsaturated monomer may homopolymerize substantially before reacting with the unsaturated carboxylic acid if it is considerably more reactive than the acid or if it is used in substantially greater quantities. Conversely, the unsaturated carboxylic acid may homopolymerize substantially before reacting with the ethylenically unsaturated monomer if it is more reactive or used in substantially greater quantities. Consequently, the exact sequential structure of the photopolymer is not clearly known, although it is believed that it will probably be a random type copolymer, but it may also, however, be a block or graft copolymer depending upon the manner in which the ingredients interact under any particular set of conditions, as discussed above.

Each segment performs a necessary and desired function. Segment I, being non-water-soluble and organic solvent-soluble, contributes to the oleophilic nature of the photopolymer and assists in the ability of the light exposed polymer to take ink and print. More importantly, Segment I, also because of its organic solvent solubility, serves as a bridge in keeping water-soluble Segment III in solution and permitting the reaction to go forward as described. Without Segment I, Segment III is quite likely to polymerize by itself and produce, for example, polymethacrylic acid which precipitates from solution before being partially esterified through reaction with the monoepoxide. Segment II provides the light-sensitivity, the polymer being more sensitive with increasing content of Segment II and, as hereinafter described, with increasing average molecular weight of the photopolymer as well. Segment III provides the solubility of the polymer in aqueous alkaline solution, such solubility being roughly proportional to the molar quantities of Segment III and roughly inversely proportional to the neutralization equivalent of the polymer. To assure the presence of Segment III, the alpha-beta unsaturated acid is used in an amount exceeding the molar equivalent of the monoepoxide. If, in the method of preparation wherein the defined monomer, epoxide, and acid are copolymerized, an excess or an equimolar amount of the epoxide with respect to the acid is used, there will result little or no Segment III in the polymeric chain, and the resulting polymer will be soluble only in organic solvents.

The present photopolymer possesses some of the characteristics afforded by each segment by the mere presence of such segment regardless of amount. However, to balance these characteristics and provide a desired amount of each, for example light-sensitivity as against alkaline-susceptibility, in general Segment I may comprise from about 15 mol percent to about 60 mol percent. Segment II may comprise from about 10 mol percent to about 60 mole percent, and Segment III may comprise from about 20 mol percent to about 50 mol percent. The mol percent of each segment was calculated on the basis of the neutralization equivalent and carbon-hydrogen content of the photopolymer.

In general, as the molecular weight of the photopolymer increases, its light-sensitivity increases as well. Light-sensitivity may be defined as the minimum light energy needed to convert the photopolymer to a form insoluble in the developing solution. The light-sensitivity of a given photopolymer is also affected by the type of light used for exposure (wavelength) and the thickness of the photopolymer layer. Technically, however, the extent of the light-sensitivity of a photopolymer as used in lithographic or photoengraving applications is not particularly material. It is a matter only of exposing a support member coated with the polymer through a stencil, negative or pattern for a sufficient length of time and under a sufficiently bright light to render the exposed and nonexposed areas differentially soluble, so that the plate can be washed and developed as by an aqueous alkaline solution. However, for commercial applications it will be appreciated that a minimum light-sensitivity is desirable in order to expose and develop a plate or the like within a reasonably short time. For example, a lithographic surface plate is preferably ready for development after five minutes or less of exposure. On the other hand, the photopolymer may also be too sensitive, requiring it to be used with greater precaution such as under subdued light. Accordingly, as a general rule, a photopolymer having a layer thickness suitable for surface lithographic plates preferably has a light-sensitivity within the range of from about $65\times10^3$ to $2000\times10^3$ foot-candle-seconds as provided by a white flame carbon arc source.

A preferred photopolymer is the cinnamoylated copolymer of styrene, propylene oxide, and methacrylic acid, using the acid in an amount exceeding the molar equivalent of the propylene oxide. This photopolymer may be considered as containing the following units in the polymer chain:

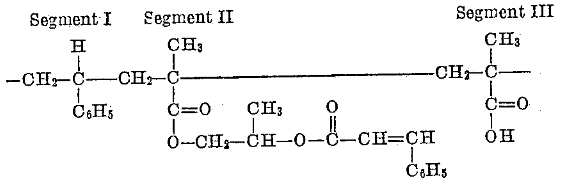

wherein Segment I comprises preferably from about 20 mol percent to about 40 mol percent, Segment II comprises preferably from about 15 mol percent to about 45 mol percent, and Segment III comprises preferably from about 25 mol percent to about 45 mol percent.

The preparation of the polymer intermediate, that is the linear polymer prior to cinnamoylation, may be carried out as the simultaneous carboxy-epoxy esterification and polymerization reactions of the defined vinyl monomer, unsaturated carboxylic acid, and monoepoxide. The resulting polyhydroxy copolymer is then cinnamoylated to provide the present photopolymer. Alternatively, a two step process can be used in which the alpha-beta unsaturated carboxylic acid is first esterified with the monoepoxide, and then the resulting hydroxyester is copolymerized with the vinyl monomer and an additional amount of alpha-beta unsaturated water-soluble aliphatic carboxylic acid.

In general, to prepare the intermediate polymer by the one step process, the three defined reactants are placed in an organic solvent and heated under reflux conditions with the acid in molar excess with respect to the monoepoxide. Normally alcoholic solvents are not used since alcohol competes with the epoxide for reaction with the acid, and also alcohol reacts with the cinnamoylating agent when it is later added. Usable solvents for not only the polymerization reaction but the cinnamoylation reaction as well include methylethyl ketone, methylisobutyl ketone, 2-methoxyethyl acetate, 2-ethoxyethyl acetate, and the like, especially when relatively high mol percentages of Segment I are present. The best solvents are dioxane and tetrahydrofuran which also facilitate the solubility of Segment III. Mixtures of solvents may also be used.

The use of catalysts facilitates the reaction. Catalysts for both the polymerization reaction and the esterification reaction between the unsaturated acid and the epoxide may be used. The polymerization catalysts include hydrogen peroxide, organic peroxides such as ascaridol, acetyl and benzoyl peroxide, dibutyryl and dilauryl peroxides, caprylyl peroxide, partially oxidized aldehydes which can contain peroxide, urea peroxide, succinic acid peroxide, fatty acid peroxides such as coconut peroxides, stearic peroxide, lauric peroxide, oleic peroxide, alcoholic peroxides such as tertiary butyl hydroperoxides and still other peroxides such as cumene hydroperoxide, tertiary butyl perbenzoate, hydroxy heptyl peroxide, chlorobenzoyl peroxide, and azo initiators such as 2,2'-azodiisobutyronitrile and azodiisobutyrate. The epoxide-carboxyl reaction is catalyzed by basic materials, for example, amines, amine salts, quaternary ammonium hydroxides and quaternary ammonium salts such as dimethylaminomethyl phenol, benzyltrimethylammonium hydroxide, and quaternary ammonium halides such as benzyltrimethylammonium chloride.

In general, the amount of peroxide used ranges from about 1 to about 4 percent, depending upon the monomers; and the amount of carboxy-epoxy catalyst employed is in the range of about 0.5 to about 6 percent, both ranges being by weight based on the reactants. Where the carboxy-epoxy catalyst is weakly basic, however, as in the case of the tertiary amines, the quantity of the latter used may range from about three to six percent by weight based on the reactants. In the preparation of the intermediate polymer, a maximum yield is favored by a proper proportion of the reactants to the solvent, so that each reaction (polymerization and esterification) proceeds to a sufficient extent. For most purposes, it is desirable to employ a solvent in a ratio of the combined three reactants to solvent of from about 1:0.4 to 1:2.

The reaction temperature for formation of the polymer intermediate ordinarily ranges between about 60° C. and the reflux temperature of the mixture. The refluxing may continue for about four to about eight hours or more, depending on the efficiency of the free radical generator and of the esterification catalyst at the reaction temperature. The average molecular weight of the terpolymer can be increased by reducing the amount of solvent. This, for example, reduces the amount of esterification of the alphbeta unsaturated acid by the epoxide, since the latter has less opportunity to react with the acid. Following its formation, it is possible to separate the intermediate terpolymer from solution by adding a non-solvent such as water or benzene and washing the resulting gel with the non-solvent. Or the solution can be used directly for the cinnamoylating step.

In the two step process previously referred to, the reactants, catalysts, solvents, conditions and the like are the same as for the one stop process except that initially the unsaturated carboxylic acid is esterified by the monoepoxide to produce a hydroxy ester, for example, hydroxyethyl methacrylate and hydroxypropyl methacrylate. Then the hydroxy ester is copolymerized with the monoethylenically unsaturated monomer and a further supply of the defined unsaturated carboxylic acid. The intermediate polymer formed by each process is similar.

To cinnamoylate the intermediate polymer, a cinnamoylating agent is added with the polymer to a solvent which can be any of the organic non-alcoholic solvents previously mentioned or, more conveniently, the cinnamoylating agent may be added to the polymer solution immediately after completion of the polymerization-esterification reaction. The solution is then heated. For example, the heating may be from about 80° C. to about 110° C. for about 30 to about 120 minutes. The cinnamoylation takes place at the hydroxyl group of the terpolymer which is present in the hydroxy ester segment. If the cinnamoylation is not complete, there will be present residual segments of the hydroxy ester in the product. These residual segments may constitute a part of Segment I in the herein defined photopolymer.

To increase the solubility of the terpolymer in aqueous alkaline solution, the carboxyl group of Segment III may be conventionally treated after the cinnamoylating step to form a water-soluble salt. Such a salt may be metallic salt, such as the sodium, potassium, and lithium salts; or an ammonium or quaternary ammonium salt. The metallic and ammonium salts are formed by a simple neutralization reaction in which an aqueous solution of the hydroxide of the metal or group to be added is admixed with the polymer solution. For example, the hydroxide of sodium, potassium, lithium, and ammonium may be used. Similarly, the quaternary ammonium salts are formed by reacting the carboxyl group of Segment III with a water-soluble amine, including water-soluble primary, secondary, and tertiary amines. Desirably, water-soluble alkyl amines are used and preferably methyl and ethyl amines. For instance, reaction of the carboxyl group with ethanolamine provides an ionic quaternary ammonium radical of ethyl ammonium. In a like manner, the symbol $R_5$ of the general structure previously described may also be methyl ammonium, dimethyl ammonium, trimethyl ammonium, diethyl ammonium and triethyl ammonium. Any of the salts of the photopolymer may be separated from the solution by addition of an organic solvent miscible with water.

In use, the acid form of the photopolymer is applied to a support member from organic solvent. The salt form of the polymer is applied from water or a mixture of water and a miscible solvent. Application may be by dipping spraying, whirler coating, etc., after which the solvent is evaporated by air drying or by heating to a deposit the photopolymer as a coat or layer. The polymer is a good film-former which facilitates this deposition. The support member may comprise any suitable rigid support of various materials such as glass, paper, resin impregnated or reinforced paper, solid resinous sheets, and the like. Normally, the backing member is metal such as aluminum, zinc, magnesium or copper in plate, sheet, or foil form, smooth or grained. In fact, as previously noted, a chief advantage of the photopolymer is that it can be used in directed contact with metal. The organic solvent may contain, as an exemplary amount, from about 0.5 percent to about 2 percent by weight of the photopolymer and may comprise any of the previously noted solvents, including dioxane, methyl ethyl ketone, methyl isobutyl ketone, 2-methoxyethyl acetate, and the like. Also, it is within the contemplation of the present invention to include with the photopolymer, as is customarily followed in the art, known sensitizers or activators, such as Michler's ketone; picric acid; 2,4,6-trinitrobenzoic acid; 1,2-benzanthraquinone; 2,5-diphenyl-p-quinone; 4,4'-tetraethyl diamino diphenyl ketone; 4,4'-tetramethyl diamino diphenyl carbinol; 4,4'-tetramethyl diamino benzophenone imide; 1-methyl-2-benzolemethylene-beta-naphthothiazoline; and 4,4'-diazidostilbene-2,2'-disulfonic acid. Also exemplary of sensitizers that may be used are U.S. Patents Nos. 2,610,120; 2,690,966; 2,670,285; 2,670,286; 2,670,287; and 2,732,301 which are hereby incorporated by reference. This sensitizer may be applied either in admixture with the photopolymer or separately from suitable solvent over the photopolymer after it has been coated on a support member as described. Ordinarily the sensitizer is applied in an amount from about 5 percent to about 10 percent by weight of the photopolymer.

The support member, coated with the photopolymer, is then exposed to light, preferably ultra-violet light, through a stencil or negative, template or pattern. The differential solubility between the exposed and non-exposed areas of the polymer coat is occasioned by cross-linking involving the benzylidene double bonds of the polymer in the exposed areas. The exposed support and polymer film is then washed with an aqueous alkaline solution which removes the non-exposed areas. The alkaline solution is sufficiently basic to remove the unexposed areas while not unduly attacking the balance of the plate such as the exposed polymer areas, the support member, or any overlying protective layer that member may have. As an example, the pH of the developing solution may range from about 7.5 to about 10. Examplary of aqueous alkaline developing solutions usable with the present photopolymer are in weight percent:

| | Percent |
|---|---|
| Ammonium hydroxide | 0.5 |
| Triethanolamine | 0.25 |
| Trisodium phosphate | 0.1 |
| Soduim carbonate | 0.5 |
| Sodium acetate | 2.5 |
| Sodium silicate solutions | 1.0 |

The use of wetting agents in the aqueous alkaline solution aids in the developing step.

In the foregoing manner, it is possible to use the present photopolymer wherever an oleophilic light-exposed residue is permissible or the light-hardened material need not be removed. Accordingly, the exposed photopolymer may be used as the printing areas of a lithographic surface plate, or as those of a letterpress plate, or for etching wherein the light-exposed polymer forms a resist. Similarly, the photopolymer can be used in preparing etched electrical circuits and the like wherein a support having a covering metal layer is coated with the polymer and a desired electrical circuit is reproduced thereon by light exposure through a suitable negative. The unexposed portions of the polymer are then washed away and the underlying metal of the sheet dissolved by acid. Finally, the hardened light-exposed resist formed from the polymer is removed to leave a metal path over the support in the form of the desired circuit.

A chief advantage of the present photopolymer is the chemical stability of its light-sensitive groups which enables the photopolymer to be used directly in contact with a support member including a metal-surfaced plate. However, there may be chemical reaction between other portions of the photopolymer and the support member resulting in a bond between the member and photopolymer. If desired, to alter the strength of the bond, either to decrease or increase it, an intervening layer or sublayer may be used. A host of different materials can form this intervening or sub-layer. Preferably, the sublayer is hydrophilic for lithographic plate applications, and therefore the sub-layer may comprise a silicate as by treating the metal plate with sodium silicate; polyacrylic acid; a polysilane-acrylic copolymer as described in U.S. Patent No. 2,991,204 to Astle; water-soluble linear copolymers of alkyl vinyl ethers and maleic anhydride compounds as described in British Patent No. 864,033; methylated methylol melamines and ethylated methylol melamines as described in U.S. Patent 2,715,619 to Suen; water-soluble polyalkylenepolyamine-melamineformaldehyde resins as described in U.S. Patent 2,796,362 to Wooding et al.; water-soluble curable condensation products of urea-formaldehyde and polyfunctional amines as described in U.S. Patent 2,554,475 to Suen et al.; water-soluble sulfonated urea-formaldehyde resins as disclosed in U.S. Patent 2,559,578 to Suen; and organo-titanates as disclosed in U.K. Patent 819,539, all of such cited patents being hereby included by reference.

In order to demonstrate the invention, the following examples are set forth for the purpose of illustration only. Any specific enumeration or detail mentioned should not be interpreted as a limitation of the invention unless specified as such in one or more of the appended claims and then only in such claim or claims.

*Example I*

A 500-ml. three-necked, round-bottom flask was fitted with a thermometer, mechanical stirrer, reflux condenser, dropping funnel, and a gas inlet. Into the flask were introduced 10.3 g. (0.099 mol) of styrene, 19.9 g. (0.232 mol) of methacrylic acid, 9.6 g. (0.166 mol) of propylene oxide, 0.8 g. of benzoyl peroxide, 1.2 g. of a 40% aqueous solution of benzyltrimethylammonium hydroxide and 27 g. of p-dioxane. The mixture was rapidly heated to the reflux temperature (about 80° C.) under a nitrogen atmosphere while maintaining constant agitation, and the reaction mixture was held at 80° C. for approximately 4.5 hours. The reaction mixture thickened as the reaction progressed. To facilitate agitation, 13 g. of dioxane was added through the dropping funnel after one hour of reaction, and then 10 g. of dioxane, after two hours of reaction. The terpolymer solution thus prepared had a 40.5% solids content and an acid number of 92.

To this polymer solution 27.6 g. of cinnamoyl chloride were added. The mixture was heated rapidly to 100° C. and maintained at that temperature for one hour. The hydrogen chloride generated was driven out of the system by introducing a steady flow of nitrogen into the flask. After one hour the rate of HCl evolution became very slow. The reaction mixture was then cooled to room temperature, diluted with 50 ml. of acetone, and 500 ml. of methanol added slowly to the solution with stirring. The precipitated polymer was repeatedly washed with methanol until the washings were colorless and then dried in a vacuum desiccator. There were obtained 40 g. of white, readily powdered solid with a neutralization equivalent of 422 and a viscosity of 26.5 centipoises in a 10 percent dioxane solution at 20° C. The polymer was soluble in dilute alkaline solutions.

An aluminum foil was cleaned in a trisodium phosphate bath and passivated in a chromic acid bath in a conventional manner. The aluminum foil was then treated as follows:

(1) The foil was dipped into a coating solution having the formulation: (*a*) 50 parts by volume of a dioxane solution of 1% by weight of the photopolymer and 0.1% by weight of Michler's ketone; (*b*) 30 parts by volume of 0.05 N sodium hydroxide aqueous solution to neutralize the acid group of the terpolymer.

(2) The solution was then evenly coated over the aluminum foil by a horizontal whirler operating at 60 r.p.m.

(3) The resulting plate was then dried under subdued light and exposed through a photographic step wedge to actinic light, using a Luxometer, for 35 Luxometer units.

(4) The plate was then washed for 0.5 minute with an aqueous dilute alkaline solution containing 0.8% sodium silicate and 0.08% of a wetting agent such as a nonionic agent like Nonic 218. The latter is polyethylene glycol t-dodecylthioether manufactured by Pennsalt Chemicals Corporation.

(5) The plate was then flushed with anhydrous ethyl alcohol and fan dried.

(6) Finally the plate was rubbed with a gum arabic solution and then inked. The plate now bearing a positive image was ready for use as a lithographic printing plate and gave 10,000 impressions without any failure.

"Luxometer" is a tradename of an instrument manufactured by The Electronic Mechanical Products Company of Atlantic City, New Jersey. Such an instrument measures cumulative quantities of light in terms of intensity-time units known as Luxometer units or "Lux" units. As used herein, a Luxometer unit is taken to be equal to 13,000 foot-candle-seconds of illumination where the intensity of light is at least 2,000 foot-candles supplied by a white flame carbon arc source.

*Example II*

A photopolymer was prepared as in Example I and coated over an aluminum plate. The plate was stored for 31 days, exposed to a negative for 50 Luxometer units, developed by washing for 2 minutes with a solution containing by weight 0.6 percent sodium silicate and 0.06 percent of a wetting agent. After rubbing with gum and inking, the plate gave 23,000 impressions without any failure.

*Examples III through V*

Three added cinnamoylated terpolymers were prepared in accordance with the procedure of Example I, differing only in the amount of reactants used. Comparative results of the four polymers are given in Table A.

TABLE A

ALKALI-SUSCEPTIBLE PHOTOPOLYMERS

| Photopolymers | Monomer, Percent [a] Styrene/ P.O./M.A. | Polymer, N.E.[b] | Polymer, Viscosity [c] | Exposure,[d] Lux. Units | Developing [e] Time, Min. |
|---|---|---|---|---|---|
| Example I | 20/37/47 | 422 | 26.5 | 20 | 1.5 |
| Example III | 41/26/33 | 653 | 27.8 | 25 | 15 |
| Example IV | 32/29/39 | 461 | 13.1 | 100 | 2 |
| Example V | 13/34/53 | 320 | 17.4 | 50 | 0.2 |

[a] Mol percent.
[b] Neutralization equivalent; the weight of polymer required to neutralize one equivalent of alkali.
[c] Viscosity in centipoises of a 10% p-dioxane solution at 20° C., determined by means of the Hoeppler falling ball method.
[d] Amount of Luxometer units required to produce the solid step No. 7 on a plate after exposure to a photographic step wedge. The plates were whirler-coated (60 r.p.m.) with dioxane solution of 1% polymer and 0.1% Michler's ketone, and developed with dioxan after exposure.
[e] Rocked in an aqueous solution of 0.25% sodium carbonate and 1% of a wetting agent.

*Example IV*

A procedure like the procedure of Example I was carried out except that 12 g. (0.166 mol) of butylene oxide was used in place of the propylene oxide. The resulting terpolymer had a 39.7 percent solids content and an acid number of 87.

A cinnamoylation was carried out like that of Example I and produced 39 g. of a light-sensitive polymer.

*Example VII*

A procedure like the procedure of Example I was carried out except that 18 g. of methyl methacrylate was used in place of the styrene, and a total of 50 g. of dioxane was added instead of 23 g. The resulting terpolymer solution had a 32 percent solids content and an acid number of 67.

The polymer solution was reacted with 27.6 g. of cinnamoyl chloride for 1.5 hours at about 100° C. The cinnamoylated polymer was precipitated by diluting the polymer solution with 1000 ml. of methanol and 500 ml. of water. After methanol washing and vacuum drying, there were obtained 40 g. of white, readily powdered material with a neutralization equivalent of 240 and a viscosity of 22.9 centipoises in a 10 percent dioxane solution at 20° C.

This polymer when coated from its solutions, exposed and developed under the plate making conditions described in Example I, gave an ink receptive image corresponding to the negative used.

*Example VIII*

A procedure like the procedure of Example I was carried out except that 18 g. of methyl methacrylate was place of styrene, and a total of 75 ml. of methyl isobutyl ketone were added during the reaction instead of 23 g. of dioxane. The polymeric product before cinnamoylation comprises white solids insoluble in the solvent medium. After treatment with cinnamoyl chloride the polymer became soluble in the solvent medium and in dilute alkaline solutions.

The polymer when coated from its solution, exposed and developed under the plate-making conditions described in Example I produces a surface lithographic plate.

*Example IX*

A terpolymer was prepared from a monomer mixture consisting of 41 mol percent of styrene, 26 mol percent of propylene oxide, and 33 mol percent of methacrylic acid. A polymerization initiator was used consisting of 2 percent of azobisisobutyronitrile by weight of the unsaturated monomers; and an esterification catalyst was used consisting of 7 percent of benzyldimethyl amine by weight of the propylene oxide.

After cinnamoylation with cinnamic acid, the polymer was coated from a dioxane solution on an aluminum foil with a polyacrylamide sub-base, exposed to a negative, and developed by rocking in an alcoholic ammonia solution. An ink-receptive image was obtained which corresponded to that on the negative.

*Example X*

The coating solution prepared in Example I was applied as a film over a copper coated, acid resistant base.

After exposure to a "negative" of an electric circuit, the unexposed areas of the film were dissolved away by flowing over them with a dilute alkaline solution of sodium silicate and the bared copper was dissolved away by rocking in a 40° Bé. aqueous ferric chloride solution. Finally, the hardened resist area of the exposed photopolymer was removed by swabbing with the same alkaline solution to leave the underlying etched circuits.

*Example XI*

Twenty milliliters of water containing 0.24 g. of sodium hydroxide was added to 20 ml. of a 10 percent dioxane solution of the photopolymer prepared in Example I. A clear solution resulted. Upon further addition of dioxane or isopropanol, the sodium salt of the photopolymer separated as a soft mass. The sodium salt was repeatedly washed with dioxane and then dried in a vacuum desiccator at room temperature. The sodium salt was soluble in water or methanol. A 0.5 percent methanol solution of the photopolymer salt after sensitization with Michler's ketone was coated on an aluminum foil, exposed to a negative, and developed by washing with warm water for one minute. The image corresponding to the negative was rendered visible by rubbing it with a gum arabic solution and a greasy ink.

*Example XII*

Two batches of photopolymer were prepared according to the procedure of Example I. The combined polymers had a neutralization equivalent of 380 and a viscosity of 25.6 centipoises in a 10 percent dioxane solution at 20° C. Elemental analysis of the combined polymers gave by weight 68.84% of carbon, 7.20% of hydrogen, and 0% of chlorine. On the basis of the neutralization equivalent and carbon-hydrogen content, the photopolymer was calculated to have a mol composition of styrene/methacryloxypropanol/methacryloxypropyl - 2 - cinnamate/methacrylic acid corresponding, respectively to 24/16/22/38 (that is, Segments I/II/III=40/22/38).

*Example XIII*

A terpolymer was prepared from a monomer mixture consisting of 12.6 g. of styrene, 11.6 g. of methacrylic acid, and 15.8 g. of hydroxypropyl methacrylate, using 0.8 g. of 2,2'-azobisisobutyronitrile as free radical initiator and 20 g. of dioxane as solvent. After an hour's reaction at 80° C., the viscous solution was diluted with 20 g. of dioxane containing 1 g. of hydroquinone. The polymer solution had a solids content of 33%, corresponding to 74% monomer conversion. The polymer was precipitated by addition of 300 ml. of methyl isobutyl ketone and then 600 ml. of water, and repeatedly washed with MIK and water. After vacuum drying, the polymer weighed 27 g. and had a neutralization equivalent of 368.

Cinnamoylating of the terpolymer was carried out as in Example I, resulting in a light-sensitive polymer which was alkali-susceptible.

In the foregoing examples, known equivalent materials such as those disclosed herein may be substituted for those stated in the example, the times and temperatures and other parameters being adjusted where and if needed as easily determined by trial and error.

Other forms embodying the features of the invention may be employed, change being made as regards the features herein disclosed, provided those stated by any of the following claims or the equivalent of such features be employed.

I therefore particularly point out and distinctly claim as my invention:

1. A photopolymer containing from about 15 to 60 mol percent of recurring units having the general structure

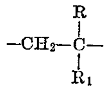

wherein R is a monovalent substituent selected from the group consisting of hydrogen and methyl and $R_1$ is the residue of an organic solvent-soluble, substantially water-insoluble polymerizable monoethylenically unsaturated monomer; about 10 to 60 mol percent of recurring units having the general structure

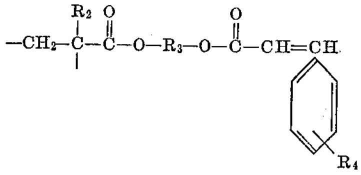

wherein $R_2$ is a monovalent substituent selected from the group consisting of hydrogen, methyl, ethyl, and the halogens, $R_3$ is the residue of a monoepoxide having a three membered epoxy ring and being substantially free of other reactive groups, and $R_4$ is a monovalent substituent selected from the group consisting of hydrogen, methoxy, ethoxy, nitro and the halogens; and about 20 to 50 mol percent of recurring units having the general structure

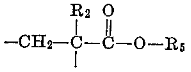

wherein $R_2$ is the same as described above and $R_5$ is a monovalent substituent selected from the group consisting of hydrogen, sodium, potassium, lithium, ammonium, methyl ammonium, dimethyl ammonium, trimethyl ammonium, ethyl ammonium, diethyl ammonium and triethyl ammonium.

2. A presensitized lithographic plate comprising a support member and a film overlying the support member consisting essentially of the photopolymer of claim 1.

3. A plate comprising a support member and the light-exposed reaction product of the photopolymer of claim 1 overlying selected areas of said support member.

4. A method of preparing a plate adapted for printing, etching and like lithographic operations comprising the steps of coating a support member with a film of the photopolymer of claim 1, exposing selected areas of the film to light to insolubilize such areas, and then removing the unexposed areas by washing with an alkaline solution.

5. The photopolymer of claim 1 in which the general structure

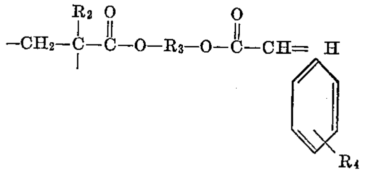

is formed from a mono-epoxide selected from the group consisting of ethylene oxide, propylene oxide, butylene oxide, styrene oxide, phenoxypropylene oxide, phenyl glycidyl ether, isopropyl glycidyl ether, butyl glycidyl ether, glycidyl benzoate, glycidyl acetate, and epichlorohydrin.

6. The photopolymer of claim 1 in which the general structure

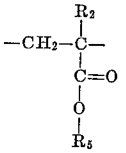

is formed from an alpha-beta unsaturated aliphatic compound selected from the group consisting of acrylic acid, alpha-halo acrylic acid, ethacrylic acid, methacrylic acid, and the sodium, potassium, lithium, and ammonium salts of all of said acids.

7. The photopolymer of claim 1 which has a light sensitivity from about $65 \times 10^3$ to $2000 \times 10^3$ foot-candle-seconds as provided by a white flame carbon arc source.

8. A stable, alkali susceptible, film forming photopolymer containing from about 20 to about 40 mol percent of recurring units having the general structure

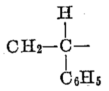

about 15 to about 45 mol percent of recurring units having the general structure

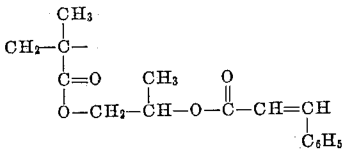

and about 25 to 45 mol percent of recurring units having the general structure

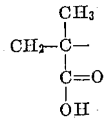

9. The photopolymer of claim 8 in which the light-sensitivity thereof is from about $65\times10^3$ to $2000\times10^3$ foot-candle-seconds as provided by a white flame carbon arc source.

References Cited

UNITED STATES PATENTS

| | | | |
|---|---|---|---|
| 2,835,656 | 5/1958 | Unruh et al. ------- | 96—115 X |
| 2,861,058 | 11/1958 | Unruh et al. ------- | 96—115 X |
| 2,908,663 | 10/1959 | Masters ---------- | 260—78.5 X |
| 3,002,959 | 10/1961 | Hicks ----------- | 260—85.7 X |

NORMAN G. TORCHIN, *Primary Examiner.*

R. H. SMITH, *Assistant Examiner.*